United States Patent
Tong et al.

(10) Patent No.: US 12,114,583 B1
(45) Date of Patent: Oct. 8, 2024

(54) SE-BASED SELECTOR MATERIAL, SELECTOR UNIT AND METHOD FOR PREPARING THE SAME

(71) Applicant: HUAZHONG UNIVERSITY OF SCIENCE AND TECHNOLOGY, Hubei (CN)

(72) Inventors: Hao Tong, Hubei (CN); Jiangxi Chen, Hubei (CN); Lun Wang, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/676,385

(22) Filed: May 28, 2024

Related U.S. Application Data

(63) Continuation of application No. PCT/CN2023/131970, filed on Nov. 16, 2023.

(30) Foreign Application Priority Data

Aug. 1, 2023 (CN) .......................... 202310954949.4

(51) Int. Cl.
*H10N 70/00* (2023.01)
*H10B 63/00* (2023.01)

(52) U.S. Cl.
CPC ......... *H10N 70/8825* (2023.02); *H10B 63/24* (2023.02); *H10N 70/023* (2023.02); *H10N 70/026* (2023.02); *H10N 70/841* (2023.02)

(58) Field of Classification Search
CPC ............. H10N 70/8825; H10N 70/023; H10N 70/026; H10N 70/841; H10B 63/24
See application file for complete search history.

(56) References Cited

U.S. PATENT DOCUMENTS 11,139,431 B2 * 10/2021 Chiang ................. H10N 70/24
11,152,428 B2 * 10/2021 Ikarashi ............. H10N 70/8616
(Continued)

FOREIGN PATENT DOCUMENTS

| CN | 111771274 | 10/2020 |
| CN | 108666417 | 5/2022 |

(Continued)

OTHER PUBLICATIONS

"International Search Report (Form PCT/ISA/210) of PCT/CN2023/131970", mailed on Apr. 10, 2024, pp. 1-4.
(Continued)

*Primary Examiner* — Allison Bernstein
(74) *Attorney, Agent, or Firm* — JCIPRNET

(57) ABSTRACT

The disclosure belongs to the field of micro-nano electronic materials, and in particular to a Se-based selector material, a selector unit, and a preparation method thereof. The Se-based selector material is a compound including Ge, Se, and B elements. The chemical formula of the Se-based selector material is $(Ge_xSe_{1-x})_{1-y}B_yM_z$, in which the M element is at least one of In, Ga, Al, and Zn, and $0.1 \leq x \leq 0.9$, $0.02 \leq y \leq 0.15$, and $0 \leq z \leq 0.2$. The problems of safety and stability of the existing material selection for the selector are solved by the selector material, the selector unit, and the preparation method thereof provided by the disclosure. In addition, the threshold voltage of the selector device prepared based on the Se-based selector material is adjustable, and the comprehensive performance is good.

8 Claims, 3 Drawing Sheets

(56) References Cited

U.S. PATENT DOCUMENTS

| | | |
|---|---|---|
| 2007/0210348 A1 | 9/2007 | Song et al. |
| 2018/0019281 A1* | 1/2018 | Lee ........................ H10N 70/20 |
| 2021/0036221 A1* | 2/2021 | Ohba ..................... H10N 70/24 |

FOREIGN PATENT DOCUMENTS

| | | |
|---|---|---|
| CN | 112242487 | 8/2022 |
| CN | 111463346 | 3/2023 |
| WO | 2022158260 | 7/2022 |

OTHER PUBLICATIONS

"Written Opinion of the International Searching Authority (Form PCT/ISA/237) of PCT/CN2023/131970", mailed on Apr. 10, 2024, pp. 1-8.

* cited by examiner

SE-BASED SELECTOR MATERIAL, SELECTOR UNIT AND METHOD FOR PREPARING THE SAME

CROSS-REFERENCE TO RELATED APPLICATION

This application is a continuation of international application of PCT application serial no. PCT/CN2023/131970, filed on Nov. 16, 2023, which claims the priority benefit of China application no. 202310954949.4, filed on Aug. 1, 2023. The entirety of each of the above-mentioned patent applications is hereby incorporated by reference herein and made a part of this specification.

BACKGROUND

Technical Field

The disclosure relates to the technical field of micro-nano electronic materials, and in particular to a Se-based selector material, a selector unit, and a preparation method thereof.

Description of Related Art

With the vigorous development of big data, cloud computing, and the Internet of Things industry, accompanied by the explosive growth of massive information and the ever-expanding market demand, efficient storage and convenient transmission of data are strictly required for storage technology in the contemporary era, and various new high-performance storage technologies have also emerged. Phase change storage technology has been widely recognized in the industry because of the relatively mature material system, simple preparation process, good compatibility with CMOS, high device reliability, and advantages in speed and service life.

Currently, 3D phase change memory (PCM) adopts a crossbar array structure, and this structure requires a selecting device to be connected in series on each PCM unit. Otherwise, there will be huge leakage current, leading to malfunction, increased thermal crosstalk, and power consumption. At present, Se-based ovonic threshold switch (OTS) selector devices are widely used in 3D PCM integration applications, in which a representative material is SiGeAsSe, which has high stability and low leakage, but has to contain the highly toxic element As. At present, Se-based selectors not containing As are often doped with elements such as Sb, N, and Si to improve device performance, which improves the cycle characteristics and leakage current of the device to a certain extent. However, there is still a large gap in comprehensive performance compared with Se-based selectors containing As, especially in cycle stability, and there is still a certain gap in meeting the requirements of memory integration.

Therefore, how to provide a safe and non-toxic Se-based selector material and a selector with excellent selecting characteristics is an urgent problem to be solved.

SUMMARY

In view of the above defects or improvement needs of the related art, the purpose of the disclosure is to provide a Se-based selector material, a selector unit, and a preparation method thereof, which are used to solve the problems of safe material selection, good stability, low leakage, and adjustable threshold voltage existing in the current selectors.

To achieve the above purpose, in the first aspect of the disclosure, a Se-based selector material is provided, and the Se-based selector material is a compound including Ge, Se, and B elements. The chemical formula of the Se-based selector material is $(Ge_xSe_{1-x})_{1-y}B_yM_z$, in which the M element is at least one of In, Ga, Al, and Zn, and $0.1 \leq x \leq 0.9$, $0.02 \leq y \leq 0.15$, and $0 \leq z \leq 0.2$.

As a preferred option of the disclosure, the chemical formula of the Se-based selector material is $(Ge_xSe_{1-x})_{1-y}B_yM_z$, and preferably, $0.3 \leq x = 0.7$, $0.05 \leq y \leq 0.15$, and $0.05 \leq z \leq 0.15$.

As a preferred option of the disclosure, one or more of C, N, and Si elements are doped into the compound of the Se-based selector material; the total doping ratio of the C, N, and Si elements is less than 10% of the atomic number ratio of the Se-based selector material compound.

In the second aspect of the disclosure, a preparation method of a Se-based selector material is provided, and the method includes as follows. According to different ratios of Ge, Se, B, and M in the chemical formula $(Ge_xSe_{1-x})_{1-y}B_yM_z$, the Se-based selector material is prepared by sputtering, evaporation, chemical vapor deposition, plasma enhanced chemical vapor deposition, low pressure chemical vapor deposition, metal compound vapor deposition, molecular beam epitaxy, atomic vapor deposition, or atomic layer deposition.

In the third aspect of the disclosure, a selector unit is provided, and the Se-based selector material selector unit is an ovonic threshold switch selector, which includes a substrate, and a first metal electrode layer, a Se-based selector material layer, a buffer layer, and a second metal electrode layer sequentially stacked on the substrate.

As a preferred option of the disclosure, the thickness of the Se-based selector material layer is 10 to 100 nm.

As a preferred option of the disclosure, the first metal electrode layer and the second metal electrode layer are both inert electrodes, and the material of the inert metal electrode layer includes one or more of Pt, W, Au, Ru, Al, TiW, TIN, TaN, IrO2, ITO, and IZO; the thickness of the first metal electrode layer is 100 to 150 nm, and the thickness of the second metal electrode layer is 50 to 100 nm.

As a preferred option of the disclosure, the material of the buffer layer includes one or more of C, Ge, and $SiO_2$; the thickness of the buffer layer material is 1 to 5 nm.

In general, the above technical solution conceived by the disclosure has the following technical advantages compared with the related art.

The chemical formula of the selector material of the disclosure is $(Ge_xSe_{1-x})_{1-y}B_yM_z$, $0.1 \leq x \leq 0.9$, $0.02 \leq y \leq 0.15$, $0 \leq z \leq 0.2$, the compound does not contain As element, and x, y, and z are atomic percentages of the elements.

First, by doping with the B element, an As-doping-like effect is achieved. Through first principle calculation, it is found that after doping with the B element, the mean square displacement of the system is reduced by nearly half, which greatly improves the stability of the system, and further enables the selector device prepared based on the selector material of the disclosure to show good cycle characteristics and threshold voltage drift stability.

In addition to doping with the B element, at least one element selected from In, Ga, Al, and Zn is doped. On the one hand, the content of the B element that can be stably doped can be increased. When the B element doping ratio exceeds 5% of the total atomic number ratio of the compound, the stability of the alloy material is good. On the other hand, the threshold voltage of the selector device prepared from the selector material may be adjusted to meet the needs of different integrated devices.

When not doped with elements such as In, Ga, Al, and Zn, the compound of the disclosure can also realize a selector unit having a selecting characteristic, and the cycle stability is also improved to a certain extent. Compared with the case of being doped with elements such as In, Ga, Al, and Zn, the threshold voltage of the selector unit not doped with elements such as In, Ga, Al, and Zn is lower, but may still be used in some application scenarios that require a low operating voltage.

Furthermore, the compound provided by the disclosure does not contain As element, thus providing a Se-based selector material free from the highly toxic element As. Compared with other Se-based selectors not containing As, the leakage current is reduced to a certain extent while the on-current is similar, the disclosure has significant advantages in cycle stability and threshold voltage drift stability, the cycle stability can be improved by two to three orders of magnitude, and the disclosure has the potential to replace the application of the Se-based selectors containing As in 3D PCM integration.

The selector material of the disclosure is preferably doped with a small amount of at least one of C, N, and Si elements, which is beneficial to further improve the thermal stability of the selector unit to meet the temperature requirements of the back-end process of preparing the selector device from the selector material.

The disclosure provides a preparation method of a selector material, which includes sputtering, evaporation, chemical vapor deposition, plasma enhanced chemical vapor deposition, low pressure chemical vapor deposition, metal compound vapor deposition, molecular beam epitaxy, atomic vapor deposition, or atomic layer deposition. In the methods, magnetron sputtering is to select target materials based on the components of the compound to achieve sputtering. During the deposition process, the substrate temperature is low, the damage to the deposited film is small, and the deposited film has high purity and is well bonded to the substrate.

When the selector material provided by the disclosure is used as the selecting medium of the selector unit, the selector has a good cycle and threshold voltage drift stability, and a wide range of adjustable threshold voltage can be achieved by adjusting the ratio of the selector material.

In summary, the disclosure provides a Se-based selector material, and also provides a selector unit based on the material which is non-toxic and has a good stability, a low leakage current, and an adjustable threshold voltage.

DESCRIPTION OF THE EMBODIMENTS

Figure 1:
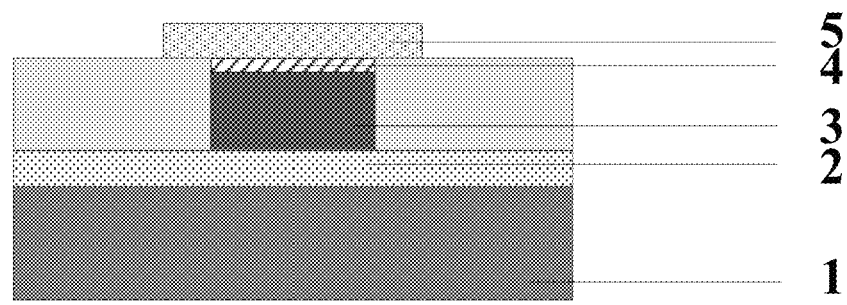
FIG. 1 is a schematic structural diagram of a Se-based selector provided in an embodiment of the disclosure.

In order to make the purpose, technical solutions, and advantages of the disclosure more comprehensible, the disclosure is further described in detail below together with the accompanying drawings and embodiments. It should be understood that the specific embodiments described herein are only used to explain the disclosure, and are not used to limit the disclosure. In addition, the technical features involved in the various embodiments of the disclosure described below may be combined with each other as long as the features do not conflict with each other.

In the disclosure, preparation of a Se-based selector material is as follows.

According to different atomic ratios of Ge, Se, B, and M in the chemical formula $(Ge_xSe_{1-x})_{1-y}B_yM_z$, the Se-based selector material film is prepared by sputtering, evaporation, chemical vapor deposition, plasma enhanced chemical vapor deposition, low pressure chemical vapor deposition, metal compound vapor deposition, molecular beam epitaxy, atomic vapor deposition, or atomic layer deposition.

When the Se-based selector material is prepared by sputtering, the component ratio of the Se-based selector material is adjusted by controlling the power of each target material in magnetron sputtering. The sputtering method may optionally be performed as follows.

The Se-based selector material is prepared by co-sputtering germanium selenide, boron, and an M element target material through a magnetron sputtering process.

Alternatively, the Se-based selector material is prepared by co-sputtering a germanium selenide alloy target doped with M and the M element target material.

Alternatively, the Se-based selector material is prepared by using the Se-based selector material target material directly for sputtering.

When the M element is not contained, only the M element target material is not used, and the preparation method is the same as the above method under the same conditions.

At the same time, the method includes as follows.

In an embodiment of the disclosure, specifically, the Se-based selector material is obtained by co-sputtering germanium selenide (GeSe), boron (B), and the M element target material, and specific process parameters are: background gas pressure $1\times10^{-5}$ pa, argon gas pressure during sputtering is 0.45 pa, and the substrate temperature is 25° C. When the M element is not contained, only the M element target material is not used, and the preparation method is the same as the above method under the same conditions.

In an embodiment of the disclosure, preparation of a Se-based selector unit is as follows.

S1: A substrate is provided, and the substrate may be a semiconductor substrate. The semiconductor substrate may be a silicon wafer with a <100> crystal phase and a layer of silicon dioxide on the surface.

Specifically, the substrate is cleaned first. The silicon wafer is sequentially placed in acetone and alcohol for ultrasonic cleaning for about ten minutes; after the ultrasonic cleaning is completed, a nitrogen gun is used to blow away the residual liquid on the surface, and the silicon wafer is dried to standby for use.

S12: A first metal layer is prepared on the substrate, and a small pore structure surrounded by silicon dioxide or other insulating materials is formed by a deposition process and an etching process.

Specifically, the first metal electrode layer is an inert metal electrode layer, and the material of the inert metal electrode layer includes at least one of Pt, W, Au, Ru, Al, TiW, TiN, TaN, $IrO_2$, ITO, and IZO.

Specifically, the pore size of the small pore structure surrounded by silicon dioxide or other insulating materials formed by the deposition process and the etching process is 50 to 1000 nm.

Specifically, firstly, an inert metal layer is formed on the substrate by magnetron sputtering as a first metal electrode layer. Afterward, a layer of silicon dioxide with a thickness of 100 nm is prepared on the first metal layer by plasma enhanced chemical vapor deposition, electron beam lithography is used to form a small pore pattern, and the small pore structure is formed by inductively coupled plasma etching.

S13: The Se-based selector material having a selecting characteristic is deposited into the small pore structure.

Specifically, the Se-based selector material layer having a selecting characteristic is deposited into the small pore structure, and the Se-based selector material layer is in direct contact with the first metal layer. In the operation, the deposition may include forming the Se-based selector material layer having the selecting characteristic by using physical vapor deposition, chemical vapor deposition, molecular beam epitaxy, atomic layer deposition, or metal organic deposition process, in which the thickness of the Se-based selector material layer is 10 to 100 nm.

S14: A buffer layer is prepared on the Se-based selector material layer.

The buffer layer material includes but is not limited to one or more of C, Ge, and $SiO_2$; the thickness of the buffer layer may be 1 to 5 nm.

S15: A second metal electrode layer is prepared on the buffer layer.

The second metal electrode layer is prepared on the Se-based selector material layer having the selecting characteristic. Specifically, the second metal electrode layer is an inert metal electrode layer, and the material of the inert metal electrode layer includes at least one of Pt, W, Au, Ru, Al, TiW, TiN, TaN, $IrO_2$, ITO, and IZO.

The Se-based selector unit prepared based on the preparation method of the Se-based selector material may be used as a Se-based selector device in a memory array to reduce leakage current.

The structure of the Se-based selector unit prepared based on the preparation method of the Se-based selector material is as shown in FIG. 1. The Se-based selector includes a substrate 1, and a first metal electrode layer 2, a Se-based selector material layer 3 not containing As, a buffer layer 4, and a second metal electrode layer 5 sequentially stacked on the substrate 1.

Specific embodiments are as follows.

Example 1

This embodiment provides a Se-based selector, and the preparation methods of the Se-based selector material and the selector unit are both the specific preparation method provided above by the disclosure.

The structure of the Se-based selector includes a substrate, and a first metal electrode layer, a Se-based selector material layer, a buffer layer, and a second metal electrode layer sequentially stacked on the substrate.

In the embodiment, the material of the substrate is silicon dioxide, and the thickness is 1000 nm.

In the embodiment, a metal layer of tungsten (W) with a thickness of 100 nm is deposited as the first metal electrode layer; a layer of tungsten (W) with a thickness of 80 nm is deposited as the second metal electrode layer.

In the embodiment, the material of the Se-based selector material layer is $Ge_{0.39}Se_{0.48}In_{0.05}B_{0.08}$, and the thickness is 30 nm.

In the embodiment, the buffer layer is a carbon (C) buffer layer of 5 nm.

Figure 2:
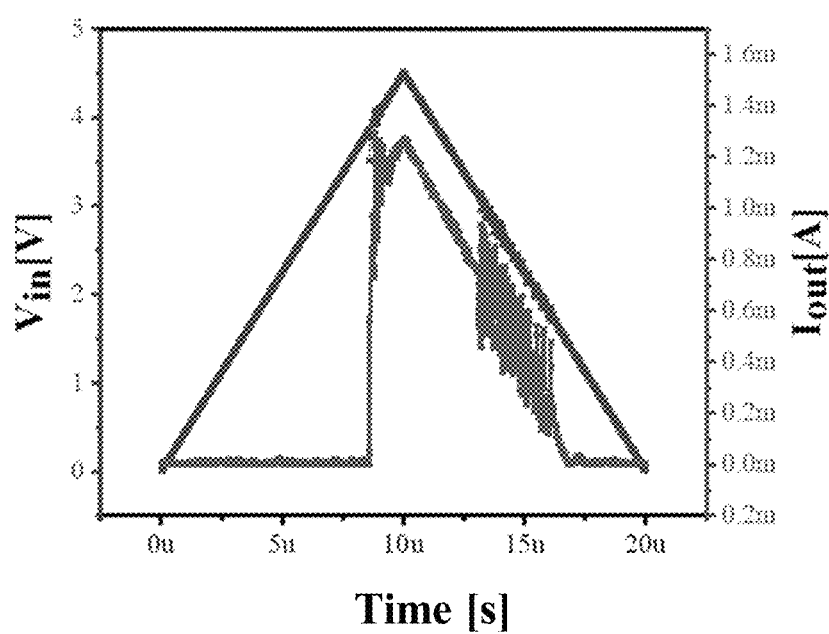
FIG. 2 is a triangle wave current response diagram of the Se-based selector provided in Example 1 of the disclosure.

FIG. 2 is a triangle wave current response diagram of the Se-based selector provided in Example 1. It may be seen from FIG. 2 that the threshold voltage of the selector unit is about 3.5V.

Figure 3:
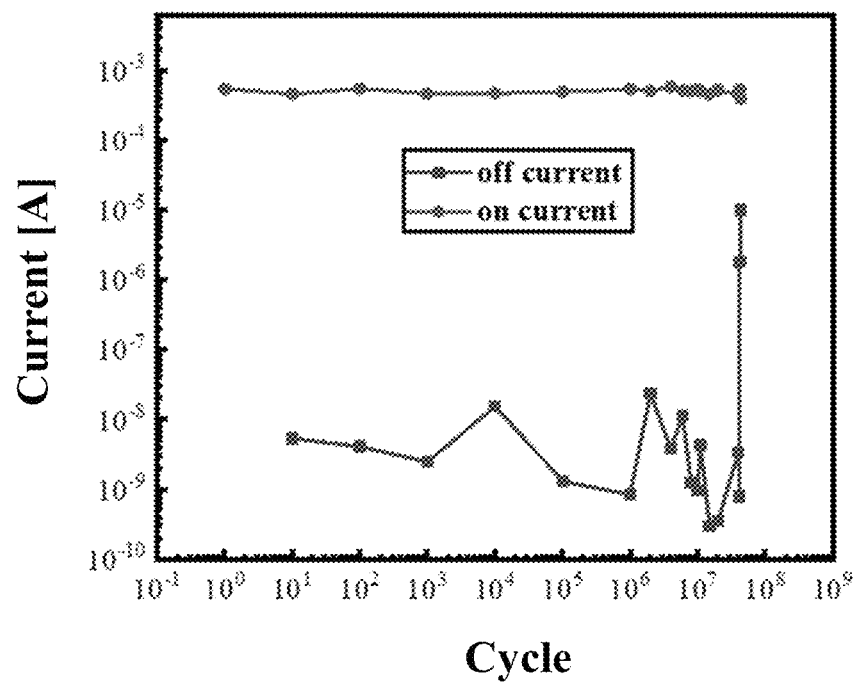
FIG. 3 is a cycle characteristic diagram of the Se-based selector provided in Example 1 of the disclosure.

FIG. 3 is a cycle characteristic diagram of the Se-based selector provided in Example 1 of the disclosure. It may be seen from FIG. 3, the cycle characteristic of the selector is good and the leakage current is small.

Figure 4:
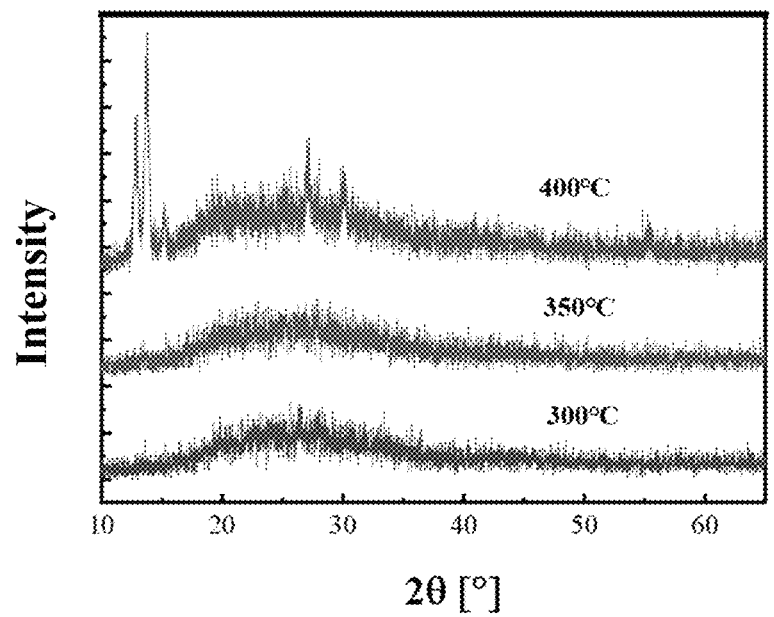
FIG. 4 is an XRD diagram of an OTS material of the Se-based selector provided in Example 1 of the disclosure.

FIG. 4 is an XRD diagram of the Se-based selector material provided in Example 1 of the disclosure, which illustrates that the thermal stability of the material is above 350° C.

Example 2

This embodiment provides a Se-based selector, and the preparation methods of the Se-based selector material and the selector unit are both the specific preparation method provided above by the disclosure. The structure and preparation method of the selector in this embodiment are the same as in Example 1.

The structure of the Se-based selector includes a substrate, and a first metal electrode layer, a Se-based selector material layer, a buffer layer, and a second metal electrode layer sequentially stacked on the substrate.

In the embodiment, the material of the substrate is silicon dioxide, and the thickness is 1000 nm.

In the embodiment, a metal layer of tungsten (W) with a thickness of 100 nm is deposited as the first metal electrode layer; a layer of tungsten (W) with a thickness of 80 nm is deposited as the second metal electrode layer.

In the embodiment, the material of the Se-based selector material layer is $Ge_{0.42}Se_{0.54}B_{0.04}$, and the thickness is 30 nm.

In the embodiment, the buffer layer is a carbon (C) buffer layer of 5 nm.

Figure 5:
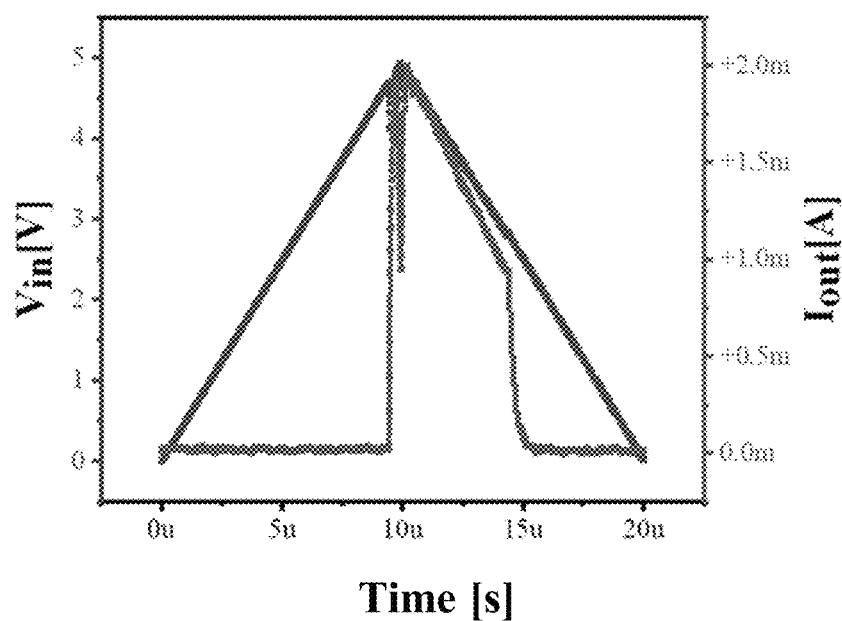
FIG. 5 is a triangle wave current response diagram of a Se-based selector provided in Example 2 of the disclosure.

FIG. 5 is a triangle wave current response diagram of the Se-based selector provided in Example 2. It may be seen from FIG. 5 that the threshold voltage of the selector unit is about 2.5V. When the M element is not contained, the selector unit has a smaller threshold voltage.

Example 3

This embodiment provides a Se-based selector, and the preparation methods of the Se-based selector material and the selector unit are both the specific preparation method provided above by the disclosure. The structure and preparation method of the selector in this embodiment are the same as in Example 1.

The structure of the Se-based selector includes a substrate, and a first metal electrode layer, a Se-based selector material layer, a buffer layer, and a second metal electrode layer sequentially stacked on the substrate.

In the embodiment, the material of the substrate is silicon dioxide, and the thickness is 1000 nm.

In the embodiment, a metal layer of tungsten (W) with a thickness of 100 nm is deposited as the first metal electrode layer; a layer of tungsten (W) with a thickness of 80 nm is deposited as the second metal electrode layer.

In the embodiment, the material of the Se-based selector material layer is $Ge_{0.34}Se_{0.42}In_{0.12}B_{0.12}$, and the thickness is 30 nm.

In the embodiment, the buffer layer is a carbon (C) buffer layer of 5 nm.

Figure 6:
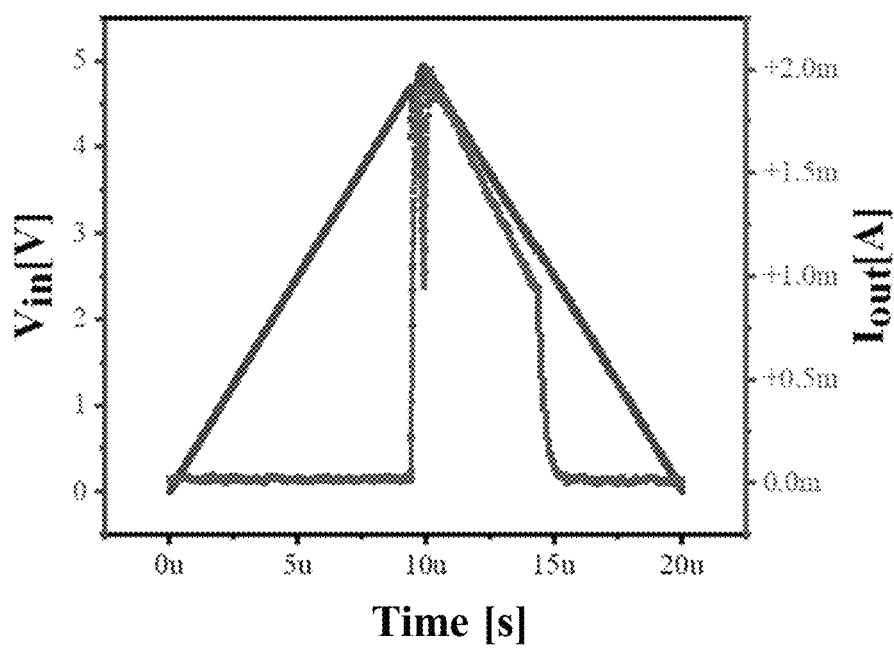
FIG. 6 is a triangle wave current response diagram of a Se-based selector provided in Example 3 of the disclosure.

FIG. 6 is a triangle wave current response diagram of the Se-based selector provided in Example 3. It may be seen from FIG. 6 that the threshold voltage of the selector unit is about 4.5V. Within a certain range, the threshold voltage of the device is significantly increased by increasing the content of the M element.

In Example 3, compared with Example 1 and Example 2, by adjusting the component of the M element, the content of the B element that can be doped can be increased, and at the same time, the threshold voltage of the device may be adjusted. When the content of the M element is appropriately increased, the threshold voltage of the device may be increased to adapt to the needs of different integration applications, and the triangle wave current response diagram of the device is as shown in FIG. 6.

It should be easily understood by persons skilled in the art that the above description is only preferred options of the disclosure and the embodiments are not intended to limit the disclosure. Any modifications, equivalent substitutions, and improvements made within the spirit and principles of the disclosure should be included in the protection scope of the disclosure.

What is claimed is:

1. A Se-based selector material, wherein the Se-based selector material is a compound comprising Ge, Se, and B elements, a chemical formula of the Se-based selector material is $(Ge_xSe_{1-x})_{1-y}B_yM_z$, in which the M element is at least one of In, Ga, Al, and Zn, $0.1 \leq x \leq 0.9$, $0.02 \leq y \leq 0.15$, and $0 \leq z \leq 0.2$.

2. The Se-based selector material according to claim 1, wherein the chemical formula of the Se-based selector material is $(Ge_xSe_{1-x})_{1-y}B_yM_z$, in which $0.3 \leq x \leq 0.7$, $0.05 \leq y \leq 0.15$, and $0.05 \leq z \leq 0.15$.

3. The Se-based selector material according to claim 1, wherein one or more of C, N, and Si elements are doped into the compound of the Se-based selector material; a total doping ratio of the C, N, and Si elements is less than 10% of an atomic number ratio of the compound of the Se-based selector material.

4. A method for preparing the Se-based selector material according to claim 1, wherein the method comprises: according to different ratios of Ge, Se, B, and M in the chemical formula $(Ge_xSe_{1-x})_{1-y}B_yM_z$, the Se-based selector material is prepared by sputtering, evaporation, chemical vapor deposition, plasma enhanced chemical vapor deposition, low pressure chemical vapor deposition, metal compound vapor deposition, molecular beam epitaxy, atomic vapor deposition, or atomic layer deposition.

5. A selector unit prepared by using the Se-based selector material according to claim 1, wherein the selector unit prepared by using the Se-based selector material is an ovonic threshold switch selector comprising a substrate, and a first metal electrode layer, a Se-based selector material layer, a buffer layer, and a second metal electrode layer sequentially stacked on the substrate.

6. The selector unit according to claim 5, wherein a thickness of the Se-based selector material layer is 10 nm to 100 nm.

7. The selector unit according to claim 5, wherein the first metal electrode layer and the second metal electrode layer are both inert metal electrodes, and materials of the inert metal electrodes include one or more of Pt, W, Au, Ru, Al, TiW, TiN, TaN, $IrO_2$, ITO, and IZO, a thickness of the first metal electrode layer is 100 nm to 150 nm, and a thickness of the second metal electrode layer is 50 nm to 100 nm.

8. The selector unit according to claim 5, wherein a material of the buffer layer comprises one or more of C, Ge, and $SiO_2$, and a thickness of the buffer layer material is 1 nm to 5 nm.

* * * * *